United States Patent
Lun et al.

(10) Patent No.: US 7,999,300 B2
(45) Date of Patent: Aug. 16, 2011

(54) MEMORY CELL STRUCTURE AND METHOD FOR FABRICATION THEREOF

(75) Inventors: Zhao Lun, Singapore (SG); James Yong Meng Lee, Singapore (SG); Lee Wee Teo, Singapore (SG); Shyue Seng Tan, Singapore (SG); Chung Woh Lai, Singapore (SG); Johnny Widodo, Singapore (SG); Shailendra Mishra, Singapore (SG); Jeffrey Chee, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 262 days.

(21) Appl. No.: 12/361,521

(22) Filed: Jan. 28, 2009

(65) Prior Publication Data

US 2010/0187587 A1    Jul. 29, 2010

(51) Int. Cl.
*H01L 27/108* (2006.01)

(52) U.S. Cl. . 257/303; 438/244; 438/387; 257/E27.098; 257/E21.008; 257/903

(58) Field of Classification Search .......... 438/244, 438/387; 257/303, E27.098, E21.008, 903, 257/E21.661, E21.653

See application file for complete search history.

(56) References Cited

U.S. PATENT DOCUMENTS

| | | | | |
|---|---|---|---|---|
| 4,894,695 A * | 1/1990 | Ishii et al. | .................. | 257/301 |
| 4,925,805 A * | 5/1990 | van Ommen et al. | .......... | 438/407 |
| 5,066,607 A * | 11/1991 | Banerjee | .................. | 438/242 |
| 5,134,085 A * | 7/1992 | Gilgen et al. | .................. | 438/210 |
| 5,427,975 A * | 6/1995 | Sparks et al. | .................. | 438/52 |
| 5,449,630 A * | 9/1995 | Lur et al. | .................. | 438/386 |
| 5,504,027 A * | 4/1996 | Jeong et al. | .................. | 438/244 |
| 5,897,351 A * | 4/1999 | Forbes | .................. | 438/242 |
| 5,998,820 A * | 12/1999 | Chi | .................. | 257/296 |
| 6,008,104 A * | 12/1999 | Schrems | .................. | 438/386 |
| 6,078,087 A * | 6/2000 | Huang et al. | .................. | 257/393 |
| 6,136,638 A * | 10/2000 | Lee et al. | .................. | 438/238 |
| 6,184,071 B1 * | 2/2001 | Lee | .................. | 438/197 |
| 6,245,636 B1 * | 6/2001 | Maszara | .................. | 438/411 |
| 6,331,459 B1 * | 12/2001 | Gruening | .................. | 438/243 |
| 6,344,390 B1 * | 2/2002 | Bostelmann et al. | ......... | 438/249 |
| 6,410,391 B1 * | 6/2002 | Zelsacher | .................. | 438/259 |
| 6,468,855 B2 * | 10/2002 | Leung et al. | .................. | 438/239 |
| 6,475,906 B1 * | 11/2002 | Lee | .................. | 438/637 |
| 6,569,732 B1 * | 5/2003 | Chiang et al. | .................. | 438/238 |
| 6,573,548 B2 * | 6/2003 | Leung et al. | .................. | 257/296 |
| 6,614,094 B2 * | 9/2003 | Leonardi et al. | .................. | 257/532 |
| 6,670,253 B2 * | 12/2003 | Lee | .................. | 438/303 |
| 6,975,531 B2 * | 12/2005 | Forbes | .................. | 365/149 |
| 7,064,371 B2 * | 6/2006 | Chin et al. | .................. | 257/296 |
| 7,229,894 B2 * | 6/2007 | Koh | .................. | 438/424 |
| 7,348,235 B2 * | 3/2008 | Fujiishi | .................. | 438/243 |
| 7,462,563 B2 * | 12/2008 | Feustel et al. | .................. | 438/700 |
| 7,605,443 B2 * | 10/2009 | Ogura | .................. | 257/522 |
| 7,619,266 B2 * | 11/2009 | Mouli | .................. | 257/291 |

(Continued)

*Primary Examiner* — N Drew Richards
*Assistant Examiner* — Ankush k Singal
(74) *Attorney, Agent, or Firm* — Horizon IP Pte Ltd

(57) ABSTRACT

A memory cell includes a substrate, an access transistor and a storage capacitor. The access transistor comprising a gate stack disposed on the substrate, and a first and second diffusion region located on a first and second opposing sides of the gate stack. The storage capacitor comprises a first capacitor plate comprising a portion embedded within the substrate below the first diffusion region, a second capacitor plate and a capacitor dielectric sandwiched between the embedded portion of the first capacitor plate. At least a portion of the first diffusion region forms the second capacitor plate.

22 Claims, 16 Drawing Sheets

U.S. PATENT DOCUMENTS

| | | | |
|---|---|---|---|
| 7,638,390 B2* | 12/2009 | Lee et al. | 438/243 |
| 7,638,828 B2* | 12/2009 | Schoellkopf | 257/300 |
| 7,714,370 B2* | 5/2010 | Kurachi | 257/298 |
| 7,863,130 B2* | 1/2011 | Hierlemann et al. | 438/248 |
| 2002/0182787 A1* | 12/2002 | Bae | 438/149 |
| 2004/0229424 A1* | 11/2004 | Fischer et al. | 438/232 |
| 2004/0229426 A1* | 11/2004 | Lee et al. | 438/248 |
| 2004/0262695 A1* | 12/2004 | Steegan et al. | 257/371 |
| 2006/0017115 A1* | 1/2006 | Tu et al. | 257/371 |
| 2006/0022242 A1* | 2/2006 | Sugatani et al. | 257/296 |
| 2006/0040466 A1* | 2/2006 | Sandhu et al. | 438/450 |
| 2006/0170044 A1* | 8/2006 | Tu | 257/347 |
| 2006/0232909 A1* | 10/2006 | Schoellkopf | 361/272 |
| 2007/0045763 A1* | 3/2007 | Yang | 257/462 |
| 2007/0080387 A1* | 4/2007 | Liu et al. | 257/303 |
| 2008/0073688 A1* | 3/2008 | Tu et al. | 257/304 |
| 2008/0224228 A1* | 9/2008 | Teo et al. | 257/379 |

* cited by examiner

MEMORY CELL STRUCTURE AND METHOD FOR FABRICATION THEREOF

FIELD OF THE INVENTION

The present invention relates generally to memory cells. More particularly, the invention relates to structures and methods for fabrication of memory cells comprising storage capacitors.

BACKGROUND OF THE INVENTION

Integrated circuits find application in many of today's consumer electronics, such as cellular phones, video cameras, portable music players, personal computing devices etc. Integrated circuits may include a combination of active devices, passive devices and their interconnections.

A common device found within an integrated circuit is semiconductor memory devices. Semiconductor memory devices are made up of a plurality of memory cells interconnected to form a memory array. Each of the memory cells being able to store one or more bits of information. In general, one basic memory cell design is duplicated numerous times to form the memory array. While the basic cell design may be modified slightly from cell to cell, for example, one cell may be a complement of an adjacent cell, the memory array is typically described according to the basic cell design.

A known type of semiconductor memory device is static random access memory (SRAM) devices. A common form of SRAM device comprises individual memory cells each made up of a combination of one or more transistors and storage capacitors. FIG. 1 illustrates the schematic view of an SRAM cell 100 known as a one transistor (1T) static random access memory (SRAM) cell. The 1T SRAM cell 100 comprises an access transistor 120 and a storage capacitor 140 for storing information. A first terminal 122 of the access transistor 120 is connected to a bit line B/L while a second terminal 124 of the access transistor is connected to a first capacitor plate 142 of the storage capacitor 140. The storage capacitor also comprises a second capacitor plate 144 which is connected to ground. The access transistor 120 further comprises a gate terminal 126 that is connected to a word line W/L. In order to access or store information in the storage capacitor, the access transistor has to be 'switched on' by activating both the bit line B/L and the word line W/L.

FIG. 2 is a cross-sectional view showing a known realization of the 1T SRAM cell shown in FIG. 1. FIG. 2 shows a semiconductor structure 200 comprising a substrate 202 such as a P-type body and a 1T SRAM cell 220 formed on an n-well 204 located within the substrate. The 1T SRAM cell 220 comprises an access transistor 240 and a storage capacitor 280. Shallow trench isolation (STI) structures 206 are provided in the substrate 202 to isolate the 1T SRAM cell 220 from adjacent SRAM cells or other devices.

The access transistor 240 is made up of a gate stack comprising a gate dielectric 242 and a gate electrode 244 overlying the gate dielectric 242. Sidewall spacers 246 are provided abutting the sidewalls of the gate electrode 244. A P-type bit line region 250 is formed in the n-well 204 adjacent a first edge of the gate electrode 244 distal from the storage capacitor 280. Meanwhile a P-type cell node region 260 is formed on the opposed side of the gate electrode 244 between the gate stack and the storage capacitor 280.

The storage capacitor 280 comprises a capacitor dielectric 282 formed over the n-well 204 and a first capacitor plate 284 overlying the capacitor dielectric 282. The first capacitor plate 284 may comprise polysilicon. The capacitor dielectric 282 and the first capacitor plate overlie a plate region 286 of the n-well 204 which forms the second capacitor plate of the storage capacitor 280.

As the demand for smaller electronic devices such as cellphones, cameras, computing devices continue, there is a corresponding need for reduction in electrical device feature sizes. Accordingly, manufacturers strive to shrink the size of memory cells such as that shown in FIGS. 1 and 2 so that their packing density can be improved. Therefore, there is a demand for memory cell designs with reduced footprint and methods for fabrication of such designs.

SUMMARY OF THE INVENTION

The present invention relates to the structure of memory cells and methods for fabrication thereof.

In accordance with a first aspect of the invention, a memory cell comprising a substrate, an access transistor and a storage capacitor is provided. The storage capacitor includes a first capacitor plate with a portion that is embedded in the substrate below a first diffusion region of the access transistor and a capacitor dielectric sandwiched between the embedded portion of the first capacitor plate and the first diffusion region of the access transistor. At least a portion of the first diffusion region of the access transistor acts as a second capacitor plate of the storage capacitor. By using a diffusion region of the access transistor as a capacitor plate and embedding another capacitor plate below it, the storage capacitor is folded or stacked under the access transistor. This advantageously leads to a corresponding lateral shrinkage in the size of the memory cell.

In accordance with another aspect of the invention, the method for fabricating a memory cell is provided. The method includes providing a substrate with a device region defined thereon and forming a first capacitor plate comprising a portion embedded within the substrate in the device region. A capacitor dielectric and an access transistor are also formed in the device region. The access transistor comprising a gate stack disposed on the substrate, and a first and second diffusion regions located on a first and second opposing sides of the gate stack, wherein at least a portion of the first diffusion region acts as a second capacitor plate and the capacitor dielectric is sandwiched between the embedded potion of the first capacitor plate and the second capacitor plate.

These and other objects, along with advantages and features of the present invention herein disclosed, will become apparent through reference to the following description and the accompanying drawings. Furthermore, it is understood that the features of the various embodiments described herein are not mutually exclusive and can exist in various combinations and permutations.

BRIEF DESCRIPTION OF THE DRAWINGS

In the drawings, like reference numbers generally refer to the same parts throughout the different views. Also, the drawings are not necessarily to scale, emphasis instead generally being placed upon illustrating the principles of the invention. In the following description, embodiments of the invention will now be described, by way of example with reference to the drawings of which.

DESCRIPTION OF THE INVENTION

The present invention relates generally to memory cells and in particular, to the size reduction of memory cells. A memory cell comprising an access transistor and a storage capacitor is provided. The storage capacitor comprising a first capacitor plate having a portion that is embedded within a substrate with a first diffusion region of the access transistor located over the first capacitor plate. A capacitor dielectric is sandwiched between the embedded portion of the first capacitor plate and the first diffusion region of the access transistor. The first diffusion region of the access transistor forms a second capacitor plate of the storage capacitor.

FIGS. 3-13 are cross-sectional views illustrating an embodiment for fabricating a 1T SRAM memory cell with a PFET access transistor. It should be noted, however, that the embodiments of the invention are described in the context of fabricating a 1T SRAM memory cell with a PFET access transistor for illustrative purposes only. It is to be appreciated that the present invention is not limited as such and is equally applicable to the formation of other memory devices such as memory cells having an NFET access transistor, memory cells having more than one transistor and/or storage capacitor as well as other types of memory devices such as dynamic random access memory (DRAM) devices.

Additionally, it is to be understood that a plurality of conventional processes that are well known in the art and not repeated herein, may precede or follow FIGS. 3-13. Moreover, it is to be understood that many modifications, additions, and/or omissions may be made to the processes described without departing from the scope or spirit of the claimed subject matter. For example, the process described below may include fewer, or additional steps. Also, it is to be appreciated that the present disclosure need not be limited to the initial semiconductor structure depicted by FIG. 3.

Figure 1:
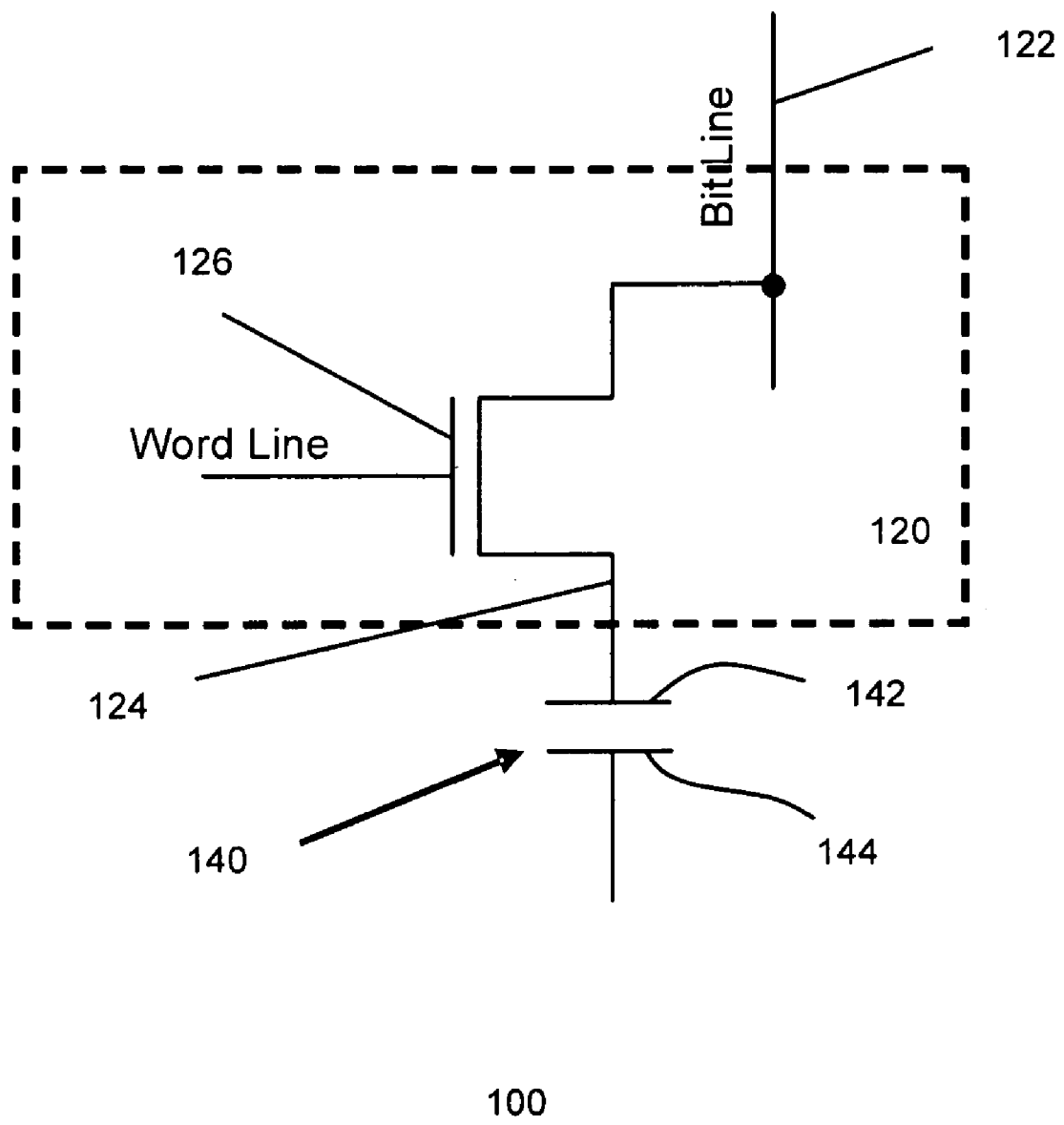
FIG. 1 is a schematic of a known one transistor (1T) Static Random Access Memory (SRAM) cell.
Figure 2:
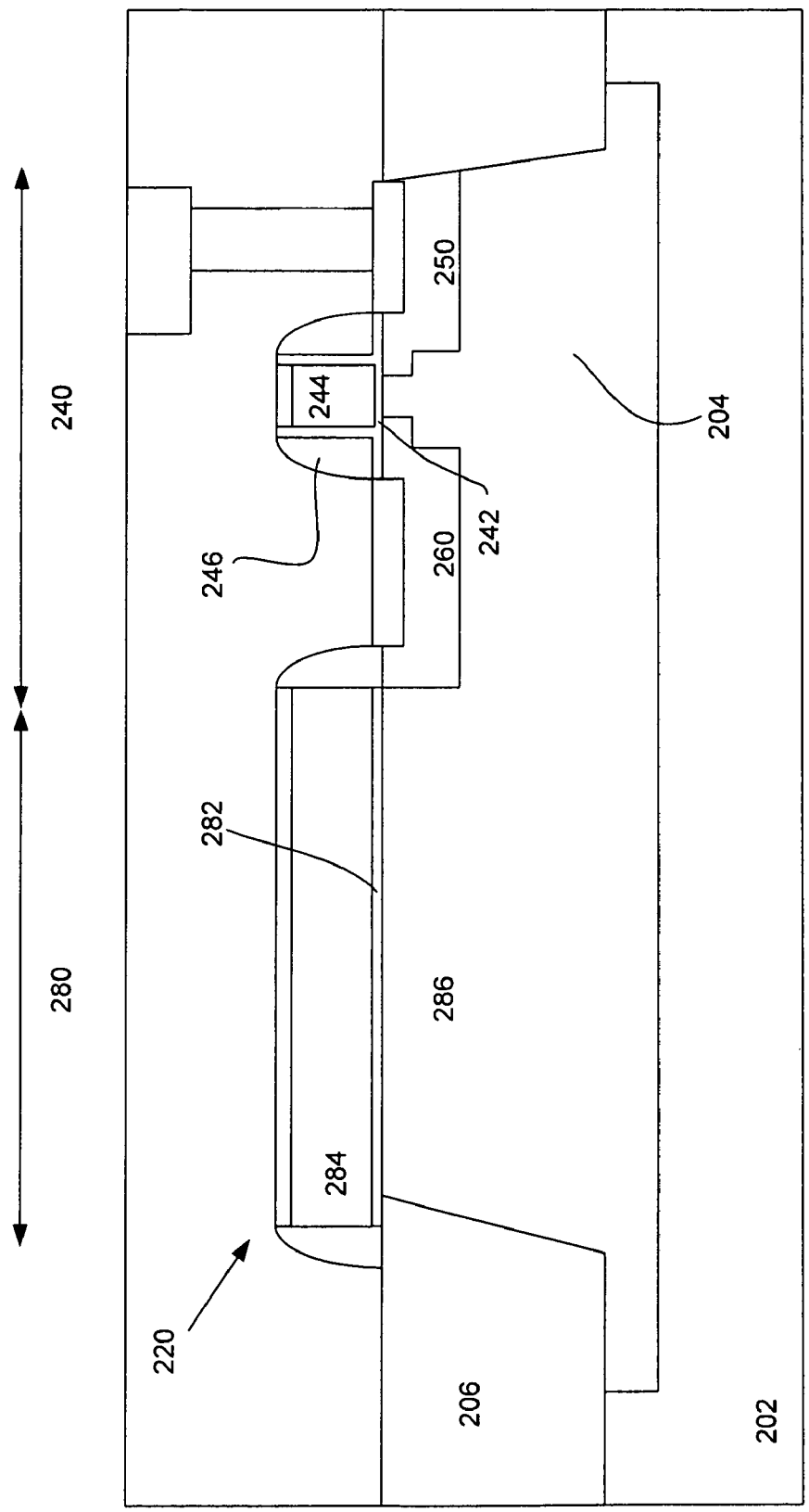
FIG. 2 is a cross-sectional view of a known realization of the 1T SRAM cell of FIG. 1.
Figure 3:
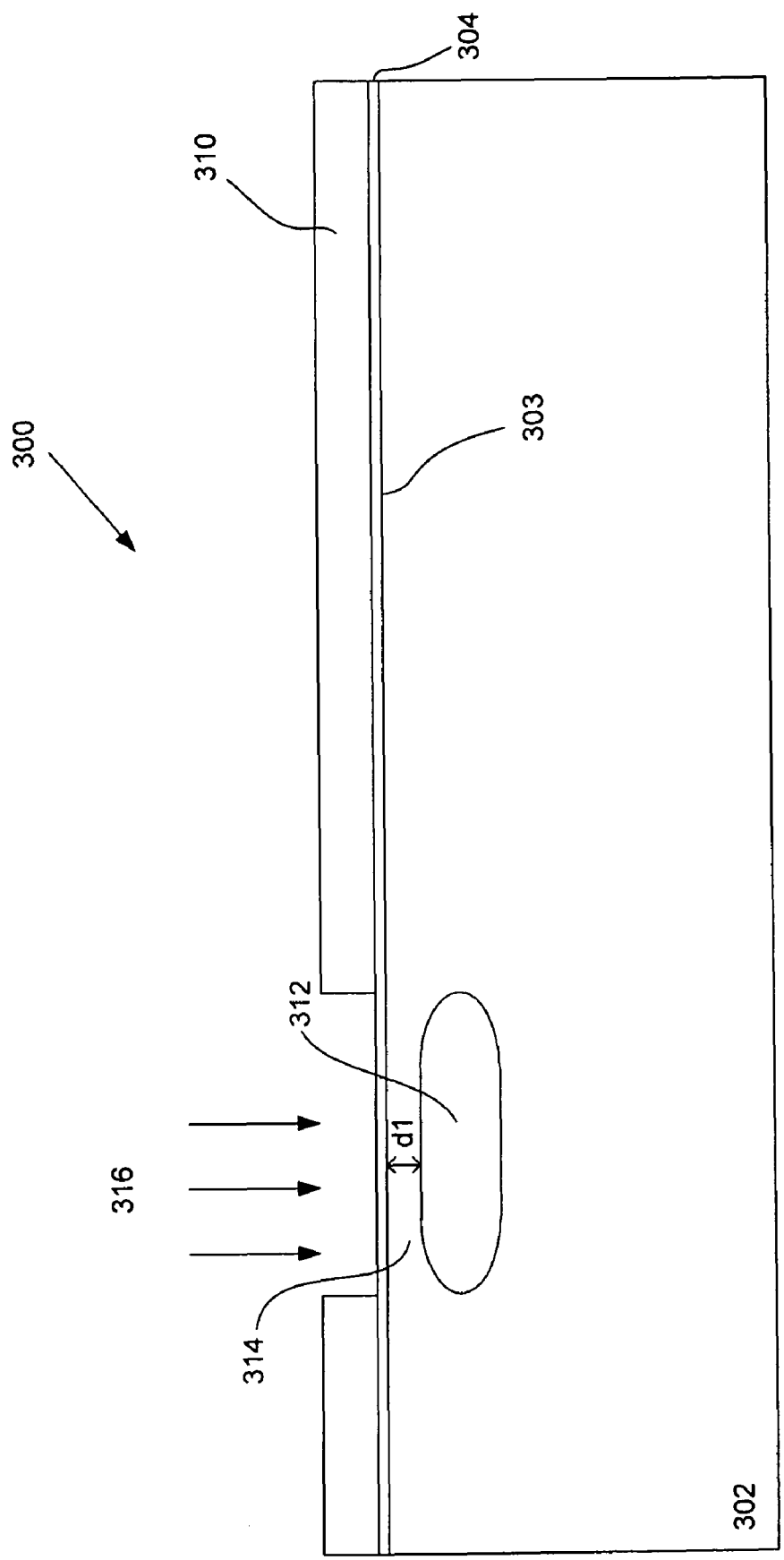
FIGS. 3 to 13 are cross-sectional views illustrating the results of progressive stages in fabricating a 1T SRAM cell in accordance with an embodiment of the invention.

FIG. 3 shows a schematic cross-sectional view of a semiconductor structure 300 at an early stage of fabrication thereof in accordance with one embodiment of the invention. A semiconductor substrate 302 having a first buried region 312 formed therein is provided. The first buried region 312 is located at a distance $d_1$ from the principal surface 303 of the semiconductor substrate 302 with a first undoped surface region 314 separating the first buried region 312 and the principal surface 303. A first oxide layer 304 and an overlying first mask layer 310 are located over the principal surface 303 of the semiconductor substrate 302.

As illustrated in FIG. 3, the first mask layer 310 acts as a mask for selectively implanting first dopant ions 316 (depicted by arrows 316) into the substrate to form the first buried region 312. The implant conditions are selected to create a first dopant implant range that is situated within the subsurface region of the substrate 302. This results in the first buried region 314 being spaced at a predetermined depth $d_1$ from the principal surface 303 of the substrate 302. It is to be understood that a multitude of implantation parameters such as implant dose, implant energy and first dopant species, can be adjusted to modulate the depth of the first buried region 312. In one embodiment, $d_1$ is between about 5 to 25 nm. Alternatively, other values of $d_1$ that enhances the performance of the integrated circuit structure may also be used.

As described in the succeeding paragraphs, the first buried region 312 will be subsequently removed to create an embedded cavity at its location. Therefore, the first dopant ions species and implant conditions are selected so as to create a first buried region 312 that has a high etch selectivity with respect to the substrate region adjacent to it. This is so that an etchant can be used to selectively etch the material in the first buried region 312 with minimal etching of the surrounding substrate region. In one embodiment, the first buried region 312 is a highly doped N-type region. In general, the higher the N-type doping concentration of the first buried region 312, the better the etch selectivity of the first buried region 312 with respect to the surrounding substrate region. Further, the dimensions of the embedded cavity are also determined by the range of the first dopant profile, therefore, the implant conditions are also selected with the desired cavity dimensions in mind.

In a preferred embodiment, the first dopant ions are slow diffusing N-type dopant species such Antimony (Sb), Arsenic (As) or compounds thereof. Slow diffusing dopant species have a low tendency to diffuse or spread outwards from the as-implanted dopant profile when the semiconductor structure 300 is subjected to thermal treatment in subsequent steps. The benefit associated with a more abrupt transition in doping concentration between the first buried region 312 and the surrounding substrate region is that it leads to a greater etch rate difference between the two regions and hence a better defined cavity profile. It is to be appreciated that the preceding examples of first dopant ions are not restrictive and other dopants that permit the formation of a first buried region which is selectively etchable with respect to the adjacent substrate region may also be used. Additionally, the dopant ions are also selected to provide a first undoped surface region 314 in the substrate overlying the first buried region 312.

Each of the foregoing substrate 302, first oxide layer 304 and first mask layer 310 are generally conventional in the semiconductor fabrication art.

In the presently described embodiment, the substrate 302 is a P-type silicon substrate. However, the invention is not limited as such but also contemplates other semiconductor substrates that physically and electrically enables the formation of active and/or passive device structures. For example, the substrate 302 may comprise any semiconductor material such as silicon-germanium, germanium, InAs, other III/V or II/VI compound semiconductors as well as composite substrates such as silicon on insulator configurations.

The first oxide layer 304 which is optional serves the purpose of reducing damage to the surface of the semiconductor substrate 302 caused by implantation of the first dopant ions 316. Other materials that achieve this function may also be used.

The first mask layer 310 may comprise any masking material which is suitable for preventing the implantation of the first dopant ions 314 into the substrate regions covered by the first mask layer. Included are hard mask materials and photoresist mask materials which can be used alone or in combination.

Figure 4:
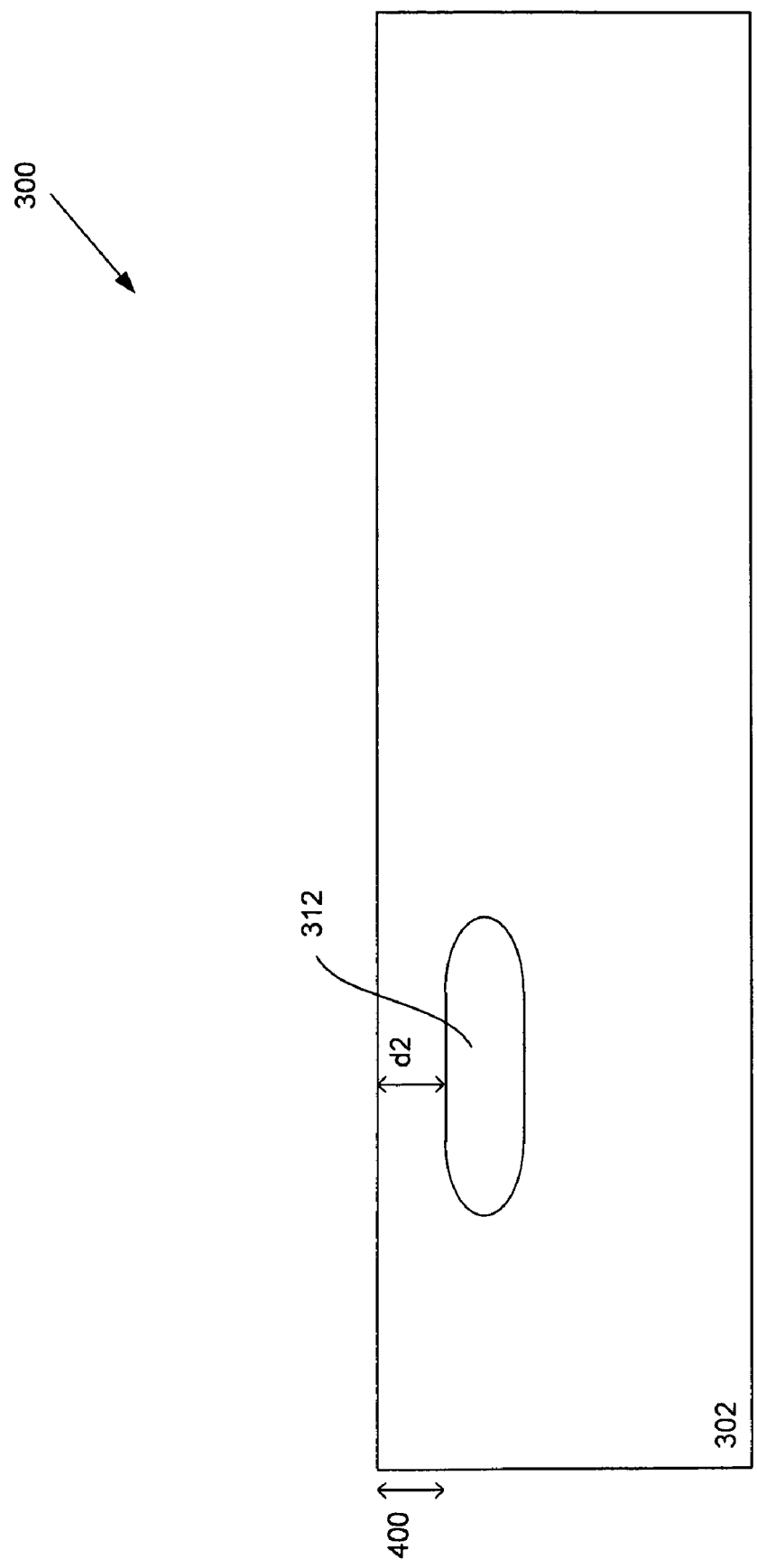

FIG. 4 shows the results of removing the first mask layer 310 and the first oxide layer 304 from the semiconductor structure 300 of FIG. 3 and subsequently growing an epitaxial layer 400 over the surface of the substrate 302. The epitaxial layer 400 incorporates the first undoped surface region 314 (as shown in FIG. 3) which was located above the first buried region 312. The first mask layer 310 and first oxide layer 304 may be removed using methods that are conventional in the semiconductor fabrication art while the epitaxial layer 400 is typically formed by chemical vapor deposition.

The depth, $d_2$ of the first buried region 312 from the surface of the substrate is determined by the thickness of the epitaxial layer 400 incorporating the first undoped surface region. The epitaxial layer 400 may comprise any of the semiconductor materials from which is comprised the substrate 302. However, substrate 302 and the epitaxial layer 400 need not comprise the same semiconductor material. As will be evident from the subsequent paragraphs, $d_2$ determines how far the subsequently formed embedded portion of a first capacitor plate is spaced from the surface of the substrate. In one embodiment, the depth $d_2$, of the first buried region 312 is between about 105 nm to 125 nm. Other values for $d_2$ are also suitable and may vary based on factors such as the desired junction depth of the subsequently formed source region overlying the embedded capacitor plate and effective resistance of the first capacitor plate. In general, the deeper the first buried region and hence embedded portion of the first capacitor plate, the higher the effective resistance of the first capacitor plate.

In a preferred embodiment, the first undoped surface region 314 of FIG. 3 is re-crystallized before the epitaxial layer 400 is grown over the substrate 302. The purpose of the recrystallization process is to improve the homogeneity of the epitaxial layer 400 being formed. This is because the first undoped surface region 314 may be amorphized when first dopant ions 316 are implanted into the substrate to form the first buried region 312. Since the characteristics of an epitaxial layer such as crystalline orientation, structure, epitaxial quality are defined by the layer over which it is grown, the characteristics of the epitaxial layer portions formed over the amorphized first undoped surface region 314 may be different from that of other regions not exposed to the first dopant ion implant. In one embodiment, the first undoped surface region 314 may be re-crystallized by subjecting the substrate 304 to a thermal treatment incorporated as an initial step in the epitaxial growth process. Alternatively, other re-crystallization methods are also suitable.

In one embodiment of the invention, the semiconductor structure 300 may also undergo a cleaning step to remove surface contaminants such as particles, organic compounds and native oxide prior to the growth of epitaxial layer.

In an alternative aspect of the invention, the above step of growing the epitaxial layer 400 is omitted. Instead, the implant conditions for the first dopant ions 316 is selected so as to locate the first buried region 312 at the depth, $d_2$ from the surface of the substrate. However, the inventors have discovered that this approach may be less preferable for the following reasons. The epitaxial layer 400 provides a surface region that has not been subjected to implant damage by the first dopant ions. In general, implant damage tends to degrade device performance, for example, by increasing leakage current. Furthermore, omitting the epitaxial layer 400 also means that the first dopant ions will have to be implanted at a higher energy in order to place the first buried region 312 at a similar depth. In general, increasing the energy of an implant causes the first ion dopant profile to have a wider spread and hence less abrupt transition in doping concentration between the first buried region 312 and the surrounding substrate region. In some cases, the first ion dopant profile can have a tail end that extends to the surface of the substrate 302. As a result, it is more difficult to control the profile of the tunnel etched through the first buried region 312. Finally, a higher implant energy also tends to increase the extent of implant damage inflicted on the substrate thus leading to degraded device performance.

Figure 5:
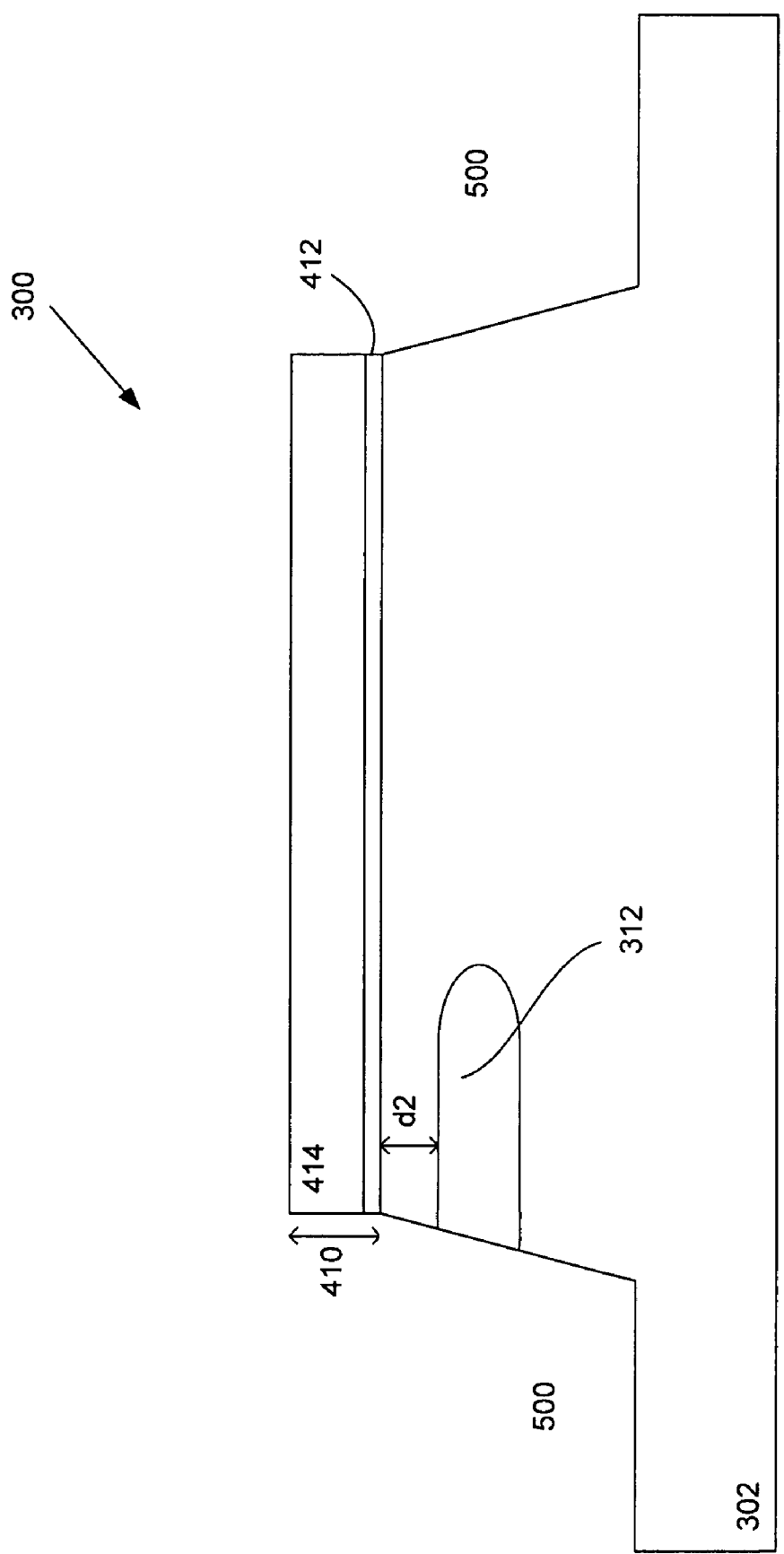

FIG. 5 shows the results of forming a second mask layer 410 on the semiconductor structure 300 of FIG. 4. The second mask layer 410 is selectively located to expose regions where trenches 500 are to be defined within the substrate 302. In the presently described embodiment, the second mask layer comprises a first pad dielectric 412 of silicon dioxide located upon the epitaxial layer 400 and a second pad dielectric 414 of nitride formed over the first pad dielectric 412. The first and second pad dielectric layers (412, 414) may be patterned using conventional photolithography and etch methods to form the second mask layer 410. It is to be understood that apart from a combination of silicon oxide and nitride, other materials that protect the substrate region underlying it from being etched may also be used to form the second mask layer 410. Additionally, the second mask layer 410 may also be a single layer structure or comprise more than two layers.

As is illustrated in FIG. 5, substrate regions not covered by the second mask layer 410 are etched to form trenches 500. At least one of the trenches 500 is located such that a portion of the first buried region 312 is exposed after trench formation. That is, the first buried region 312 is in communication with a sidewall of the trench 500.

In a preferred embodiment, a reactive ion etch (RIE) process is used to etch trenches 500 in the substrate 302. In one embodiment, the trenches are etched in a plasma comprising a combination of HBr and $O_2$ gases. Alternatively, other combinations of gases that allow the substrate 302 to be selectively etched without substantially removing the first buried region 312 are also suitable.

Figure 6:
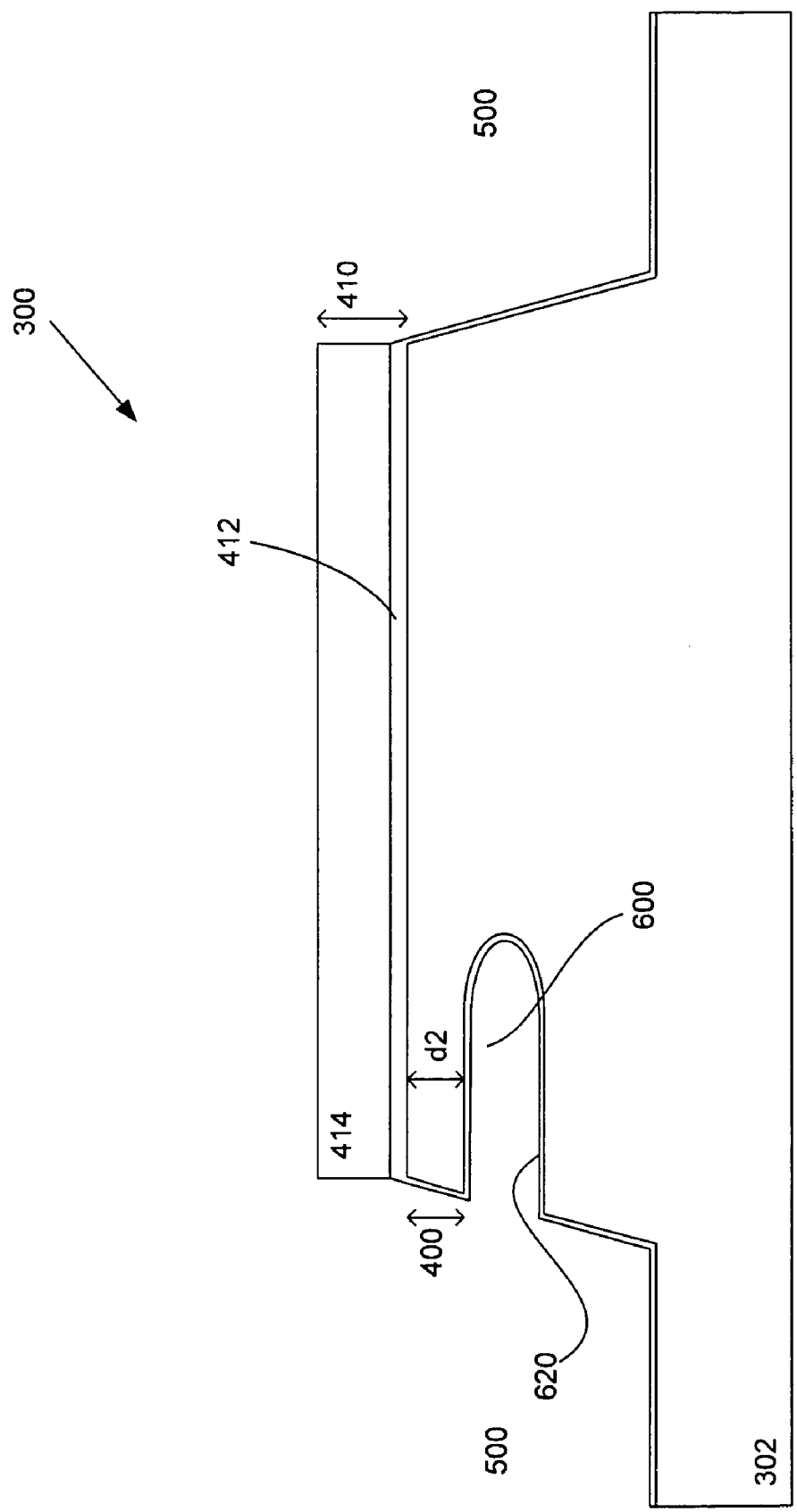

FIG. 6 shows the results of substantially removing the first buried region 312 in FIG. 5 to create a cavity 600 embedded within the substrate 302. The first buried region 312 is substantially removed by using an etchant that differentially etches the first buried region 312, while minimally etching the surrounding substrate region 302.

In a preferred embodiment, a selective, isotropic reactive ion etch (RIE) process is used to substantially remove the first buried region 312 thus providing a cavity 600 within the substrate 302. In one embodiment, the isotropic RIE process may comprise the use of $Cl_2$ and/or other chlorine-based gases. However, it is to be understood that the gases chosen for etching the first buried region 312 is not limited to $Cl_2$ and may include other gases that permits the first buried region 312 to be etched selectively while the surrounding substrate acts as an etch stop region. Preferably, the first buried region 312 is etched within the same tool as the trench 500 etch described in conjunction with FIG. 5. In an alternative embodiment, wet chemical etchants may also be used for etching the first buried region 312 to form the cavity 600.

Once the cavity 600 is formed, a liner layer 620 may be subsequently provided over the trench walls, the interior of the cavity 600 and other exposed portions of the substrate 302 as shown in FIG. 6. The liner 620 helps to repair damage caused by reactive ion etching processes used to define the trench 500 and/or cavity 600. Additionally, the liner material may also act as a stress-relief layer used to protect the substrate 302 from stress induced by isolation filler materials that are subsequently deposited to fill the trenches 500. Non-limiting examples of the liner layer 620 include oxide, silicon oxynitride.

Figure 7:
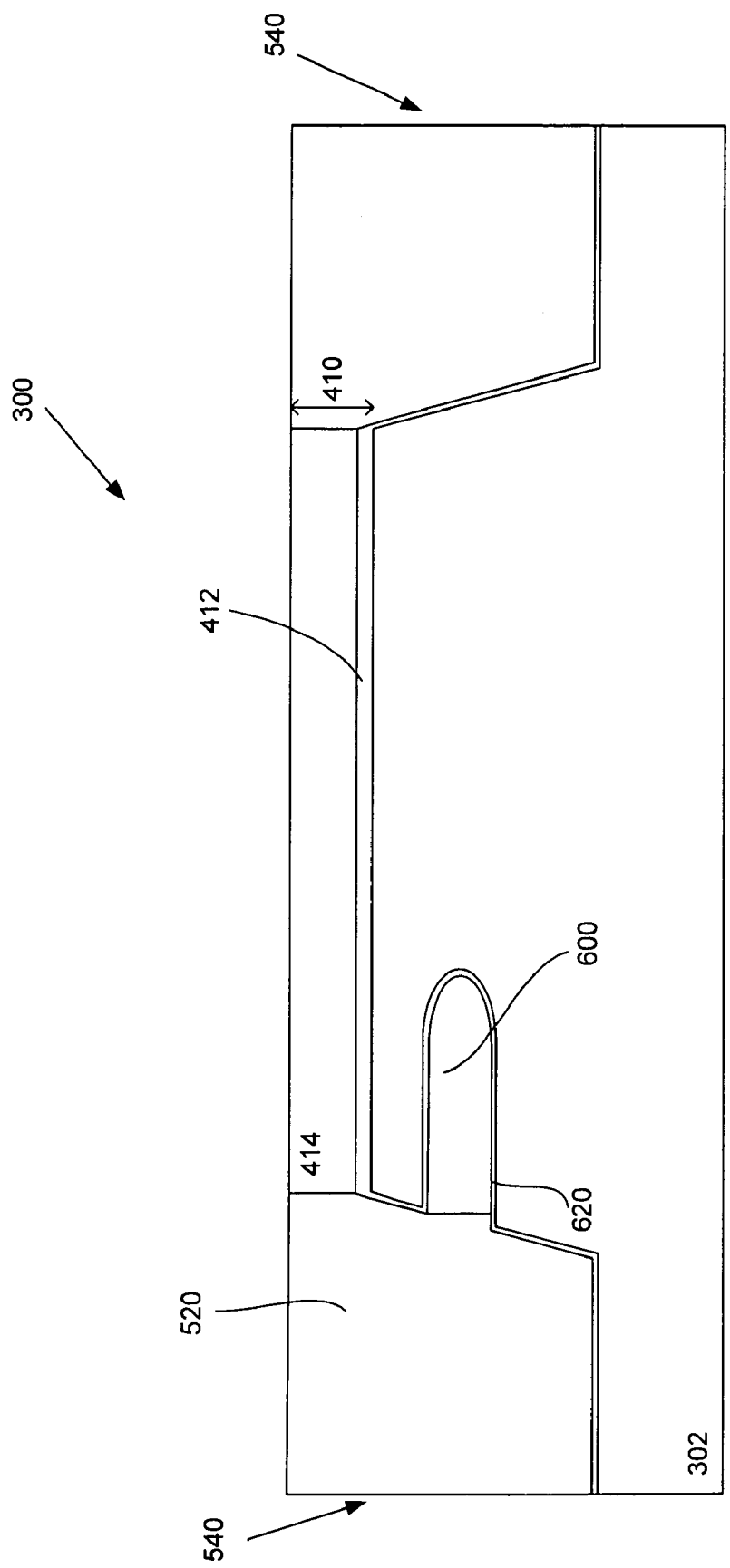

FIG. 7 shows the results of depositing an isolation filler material 520 on the semiconductor structure 300 in FIG. 6 such that the trenches 500 are filled. Excess isolation filler material 520 external of the trenches 500 are subsequently removed. In one embodiment, the isolation filler material 520 external of the trenches 500 are removed by chemical mechanical polishing (CMP) with the first pad dielectric 414 acting as a polish stop layer. The resulting trenches filled with isolation filler material 520 are known as trench structures 540. In the presently described embodiment, the trench structures 540 serve as shallow trench isolation (STI) structures.

In a preferred embodiment, the isolation filler material 520 fills the trenches 500 without substantially filling the cavity 600. In one embodiment, this is achieved by using a high-density plasma (HDP) gap-fill process to deposit the isolation filler material 520. Alternatively, other uni-directional methods of deposition are also suitable. Non-limiting examples of materials for the isolation filler material include oxides, nitrides, oxynitrides of silicon, as well as laminates and composites thereof. Alternatively, other isolation filler materials are also suitable and the isolation filler material 520 may also comprise more than one material.

Figure 8:
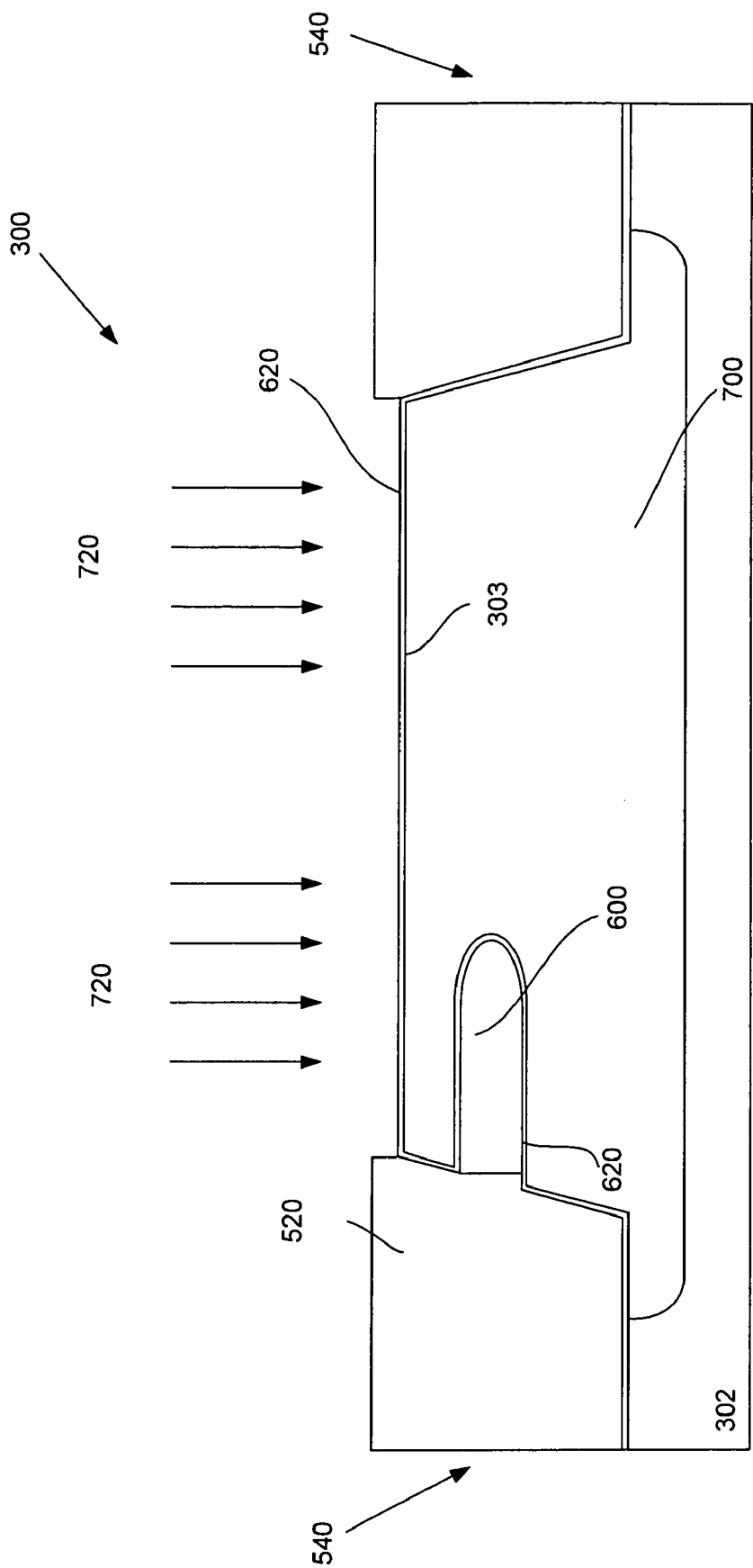

FIG. 8 shows the results of removing the second pad dielectric 414 from the semiconductor structure 300 of FIG. 7 and in turn forming a well 700 that surrounds the cavity 600 embedded within the substrate 302. As described in the succeeding paragraphs, a memory cell will be formed within the well 700. In one embodiment, the well 700 extends to a depth of about 380 to 430 nm from the principal surface 303 of the substrate 302. In the presently described embodiment, the well 700 is formed by implanting second dopant ions 720 (depicted by arrows 720) into the substrate 302.

In the presently described embodiment, since we are forming a SRAM cell with a PFET access transistor the well 700 is an n-well and the second dopant ions 720 are N-type impurity ions. Non-limiting examples of N-type dopants include Phosphorus, Arsenic or compounds thereof. For memory cells with NFET access transistors, the second dopant ions 720 are P-type impurity ions. Non-limiting examples of P-type dopants include Boron, Indium or compounds thereof. In one embodiment, the second dopant ions 720 are implanted at a dose of about $5e^{12}$ to $1e^{13}$ ions/cm². Alternatively, the SRAM cell may also be formed directly on the substrate, thereby omitting the above described well formation step.

Figure 9:
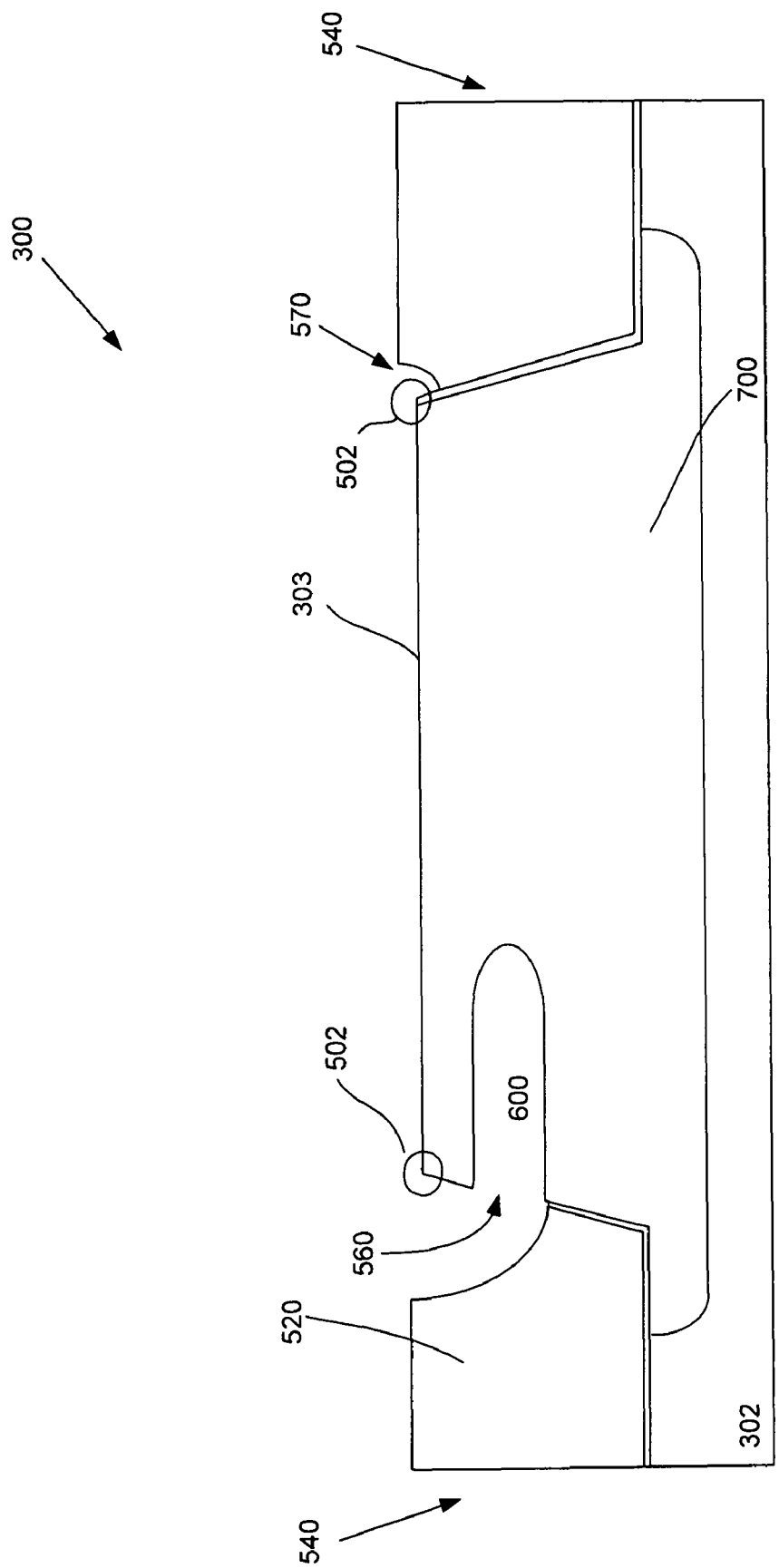

Referring now to FIG. 9, the semiconductor structure 300 of FIG. 8 is subjected to a wet etch process that creates an access path 560 through the isolation filler material 520 to the opening of the embedded cavity 600. The access path 560 is a channel located adjacent to the corner of the trench structure 540 and in communication with the opening of the cavity 600. In the presently described embodiment, the wet etch process also removes portions of the liner layer 620 overlying the principal surface 303, on exposed sidewall portions of the trench structure 540 and interior walls of the cavity 600.

In the presently described embodiment, the access path 560 is etched without the presence of a masking layer for protecting other exposed portions of the isolation filler material 520 from the wet etchant. This is possible because the inventors have discovered that the corner portions of the isolation filler material 520 can be made to have a faster etch rate relative to the bulk portions if the density of the filler material 520 at these regions is of a lower density than that of the bulk. In one embodiment, a lower filler material density proximate the trench corners 502 is achieved by using an isolation filler deposition process that involves a combination of sputter and deposition mechanisms. In particular, the filler deposition process is optimized such that the sputtering effect is greater at the corners 502 of the trench structure 540. Furthermore, the inventors have also discovered that once the wet etchant reaches the cavity 600, the portions of the isolation filler material 520 adjacent to the cavity will be etched in all directions. As a result, the access path 560 has a greater depth compared to the divot 570 simultaneously formed at the corner of a trench structure with no cavity extending from its sidewall. In view of the above, it is possible to create an access path 560 through the isolation filler material 520 without using a masking layer to protect the exposed portions of the isolation filler material 520 from excessive recessing.

Figure 10:
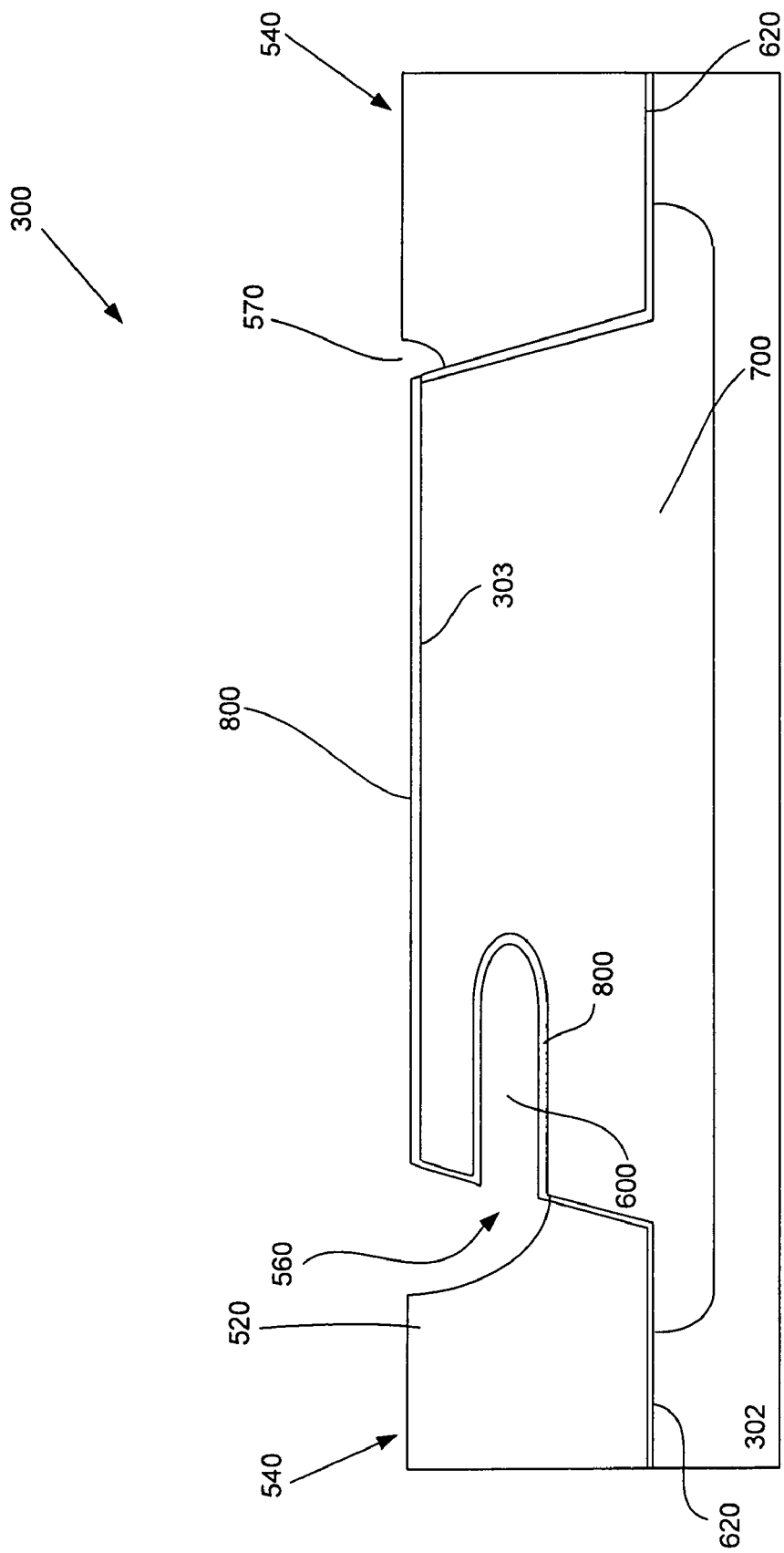

FIG. 10 shows the results of forming a dielectric layer 800 over the principal surface 303 of the substrate 302, exposed sidewalls of the trench structures 540 and interior of the cavity 600. As will be illustrated in the succeeding paragraphs, the dielectric layer 800 over the principal surface 303 of the substrate 302 can function as a gate dielectric for an access transistor while the dielectric layer 800 in the interior of the cavity 600 can function as a capacitor dielectric for a storage capacitor.

The dielectric layer 800 may comprise a dielectric material such as silicon dioxide, silicon oxynitride, silicon nitride, a high-K metal oxide or a combination thereof or the like. However, it is to be understood that the type of material chosen for the dielectric layer 800 is not limited to the above examples and may include any material that can be formed in the interior of the cavity 600 and is suitable for use as a capacitor dielectric. The dielectric layer 800 may be deposited using methods such as thermal oxidation, chemical vapour deposition, rapid thermal oxidation or the like as known in the art. Preferably, the dielectric layer 800 is deposited using a high aspect ratio process (HARP) using chemical vapour deposition. The dielectric layer 800 may range in thickness from about 20 to 30 angstroms, for example. However, the thickness of the dielectric layer is not limited to the preceding example, and may include any thickness that enhances the performance of the memory cell finally formed.

Figure 11:
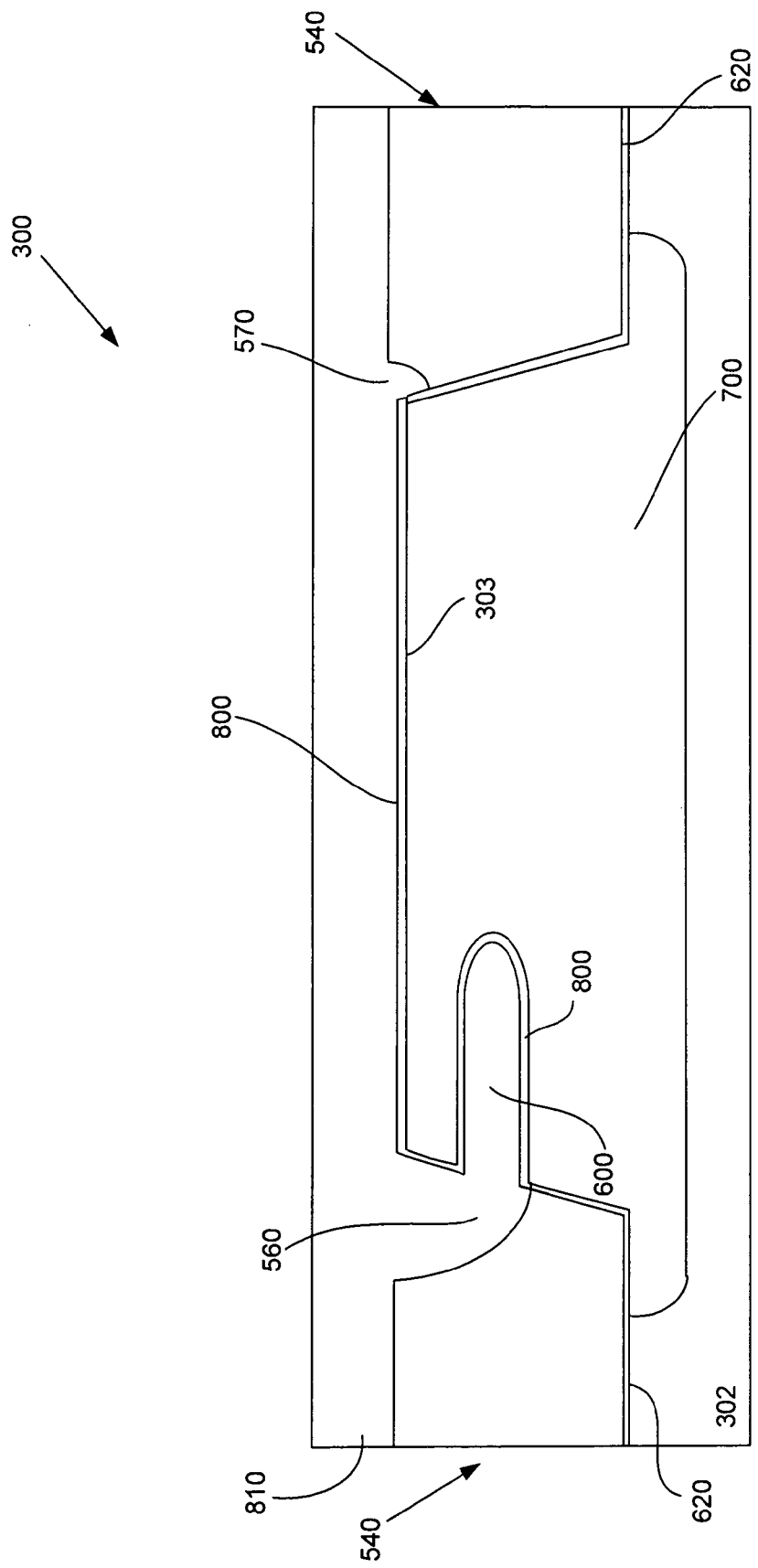

FIG. 11 shows the results of depositing an electrode layer 810 over the semiconductor structure 300 of FIG. 10. The electrode layer 810 overlies the principal surface 303 and top of the trench structure 540. It also fills the interior of the cavity 600, the access path 560 and divot 570 formed in the trench structures 540.

The electrode layer 810 may comprise a conductive or semi-conductive material such as, but not limited to, doped or undoped polysilicon. In one embodiment the electrode layer 810 comprises polysilicon doped to a doping concentration of about $1e15$ to $5e15$/cm³. However, it is to be understood that the type of material chosen for the electrode layer 810 is not limited to the above examples and may include any material is suitable for use as a capacitor plate and can be formed in the interior of the cavity 600. In one embodiment, the electrode layer 810 is deposited by chemical vapour deposition.

Figure 12:
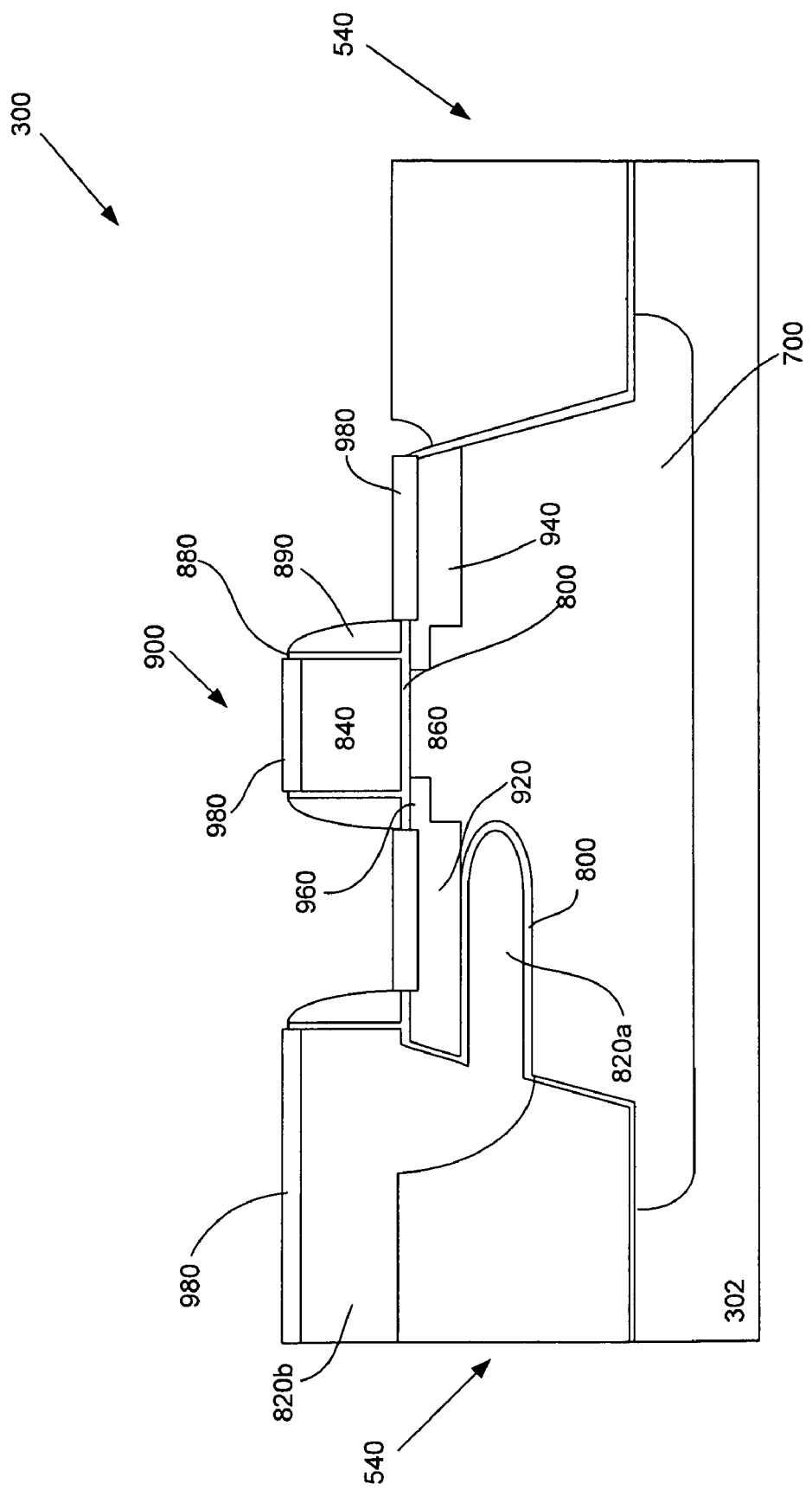

FIG. 12 illustrates the semiconductor structure 300 of FIG. 11 after the electrode layer 810 of FIG. 11 has been patterned to form a first capacitor plate 820 and a gate electrode 840. The first capacitor plate comprises an embedded portion 820a that is located within the substrate 302 and a second portion 820b that overlies the trench structure 540. The electrode layer 810 may be patterned using conventional photolithography and etching methods as are known in the art.

After defining the first capacitor plate 820 and gate electrode 840, the integrated circuit structure 300 may be further processed by additional conventional steps to form a channel region 860 in the substrate below the gate electrode 840, first spacers 880 located on opposed sides of the gate electrode 840 abutting the sidewalls thereof and second spacers 890 surrounding the first spacer 880. The foregoing first and second spacer (880, 890) formation are generally conventional in the semiconductor fabrication art and can be carried out by depositing one or more dielectric layers on the semiconductor structure and etching the dielectric layer such that only the material adjacent to the gate electrode remains. Apart from the spacer profile illustrated in FIG. 12, other types of spacers such as L-shaped spacers, disposable spacers, multiple spacers, offset spacers are also suitable. Accordingly, embodiments of the present invention may utilize different doping profiles. The combination of the gate electrode 840, gate dielectric 800 and first and second spacers (880, 890) form the gate stack 900.

A first and second diffusion region (920, 940) extending from the channel region 860 in the substrate is subsequently formed on opposed sides of the gate stack 900. In the presently described embodiment, the first and second diffusion regions (920, 940) form source and drain regions for an access transistor including gate stack 900. As illustrated in FIG. 12, the source region 920 is located above the embedded portion 820a of the first capacitor plate 820 while the drain region 940 is located on the opposed side of the gate stack remote from the first capacitor plate. It is to be understood that while FIG. 12 shows the entire source region 920 overlapping the embedded portion 820a of the first capacitor plate, an alternative embodiment may have partial overlap of the source region 920 with the embedded portion.

In the presently described embodiment, since we are forming a PFET, the source/drain regions (920, 940) are doped with P-type impurities such as but not limited to Boron, Indium or compounds thereof. For an NFET, the source/drain regions (920, 940) are doped with N-type impurities such as but not limited to Phosphorus, Arsenic or compounds thereof. In one embodiment, the source/drain regions (920, 940) can be formed by implanting source/drain dopant ions into the substrate using the first and second spacers (880, 890) as a mask.

In one aspect of the present invention, the source region 920 has the added function of acting as a second capacitor plate for a storage capacitor of a memory cell. Therefore, a storage capacitor is formed by the combination of the first capacitor plate 820, source region 920 and the capacitor dielectric 800 sandwiched between the embedded portion 820a of the first capacitor plate 820 and the source region 920. Meanwhile, the gate stack 900, source region 920 and drain region 940 form an access transistor. By using a diffusion region of the access transistor as a capacitor plate and embedding another capacitor plate below it, the storage capacitor is folded or stacked under the access transistor. This leads to a corresponding lateral shrinkage in the size of the memory cell.

In one aspect of the invention, source/drain extension regions 960 can also be formed between the channel 860 and the source/drain regions (920, 940) by a low to medium-dose implant to facilitate dimensional reductions for the scaling of the integrated circuit structure 300. The source/drain extension regions 960 have the same impurity type doping as the source/drain regions (920, 940). In another embodiment, the semiconductor structure 300 further comprises a halo region (not shown) of opposite impurity doping type to the source/drain regions (920, 940). The purpose of forming halo regions is to suppress 'punchthrough', which occurs when the channel length of the device is sufficiently short to allow the depletion regions at the ends of the source and drain extensions to overlap, leading to a breakdown condition.

Additional conventional processing steps may be used to complete fabrication of the semiconductor structure 300. For example, a source/drain anneal can be carried out to anneal/activate the source/drain regions (920, 940). The gate electrode 840, source/drain regions (820, 940) and first capacitor plate 820 can also be silicided to form silicide contacts 980 and interlayer dielectrics, contacts, vias and interconnects may be formed.

Figure 13:
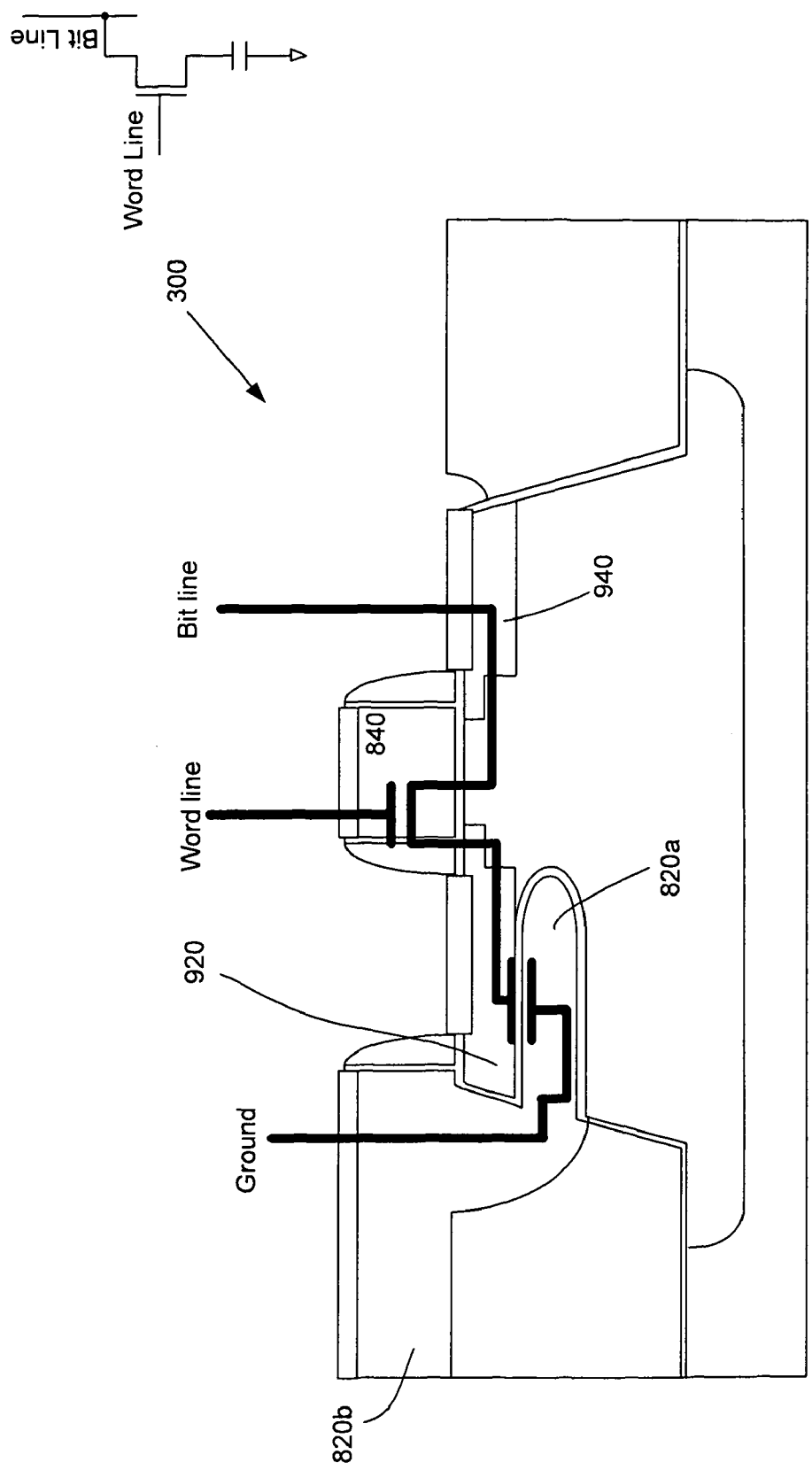

FIG. 13 illustrates one exemplary way of connecting the semiconductor structure 300 in FIG. 12 to form a 1-T SRAM cell. In this embodiment, the access transistor is a PFET. Interconnections (not shown) are formed to connect the drain region 940 to a bit line, the gate electrode 840 to a word line and the first capacitor plate 820 to ground.

Figure 14:
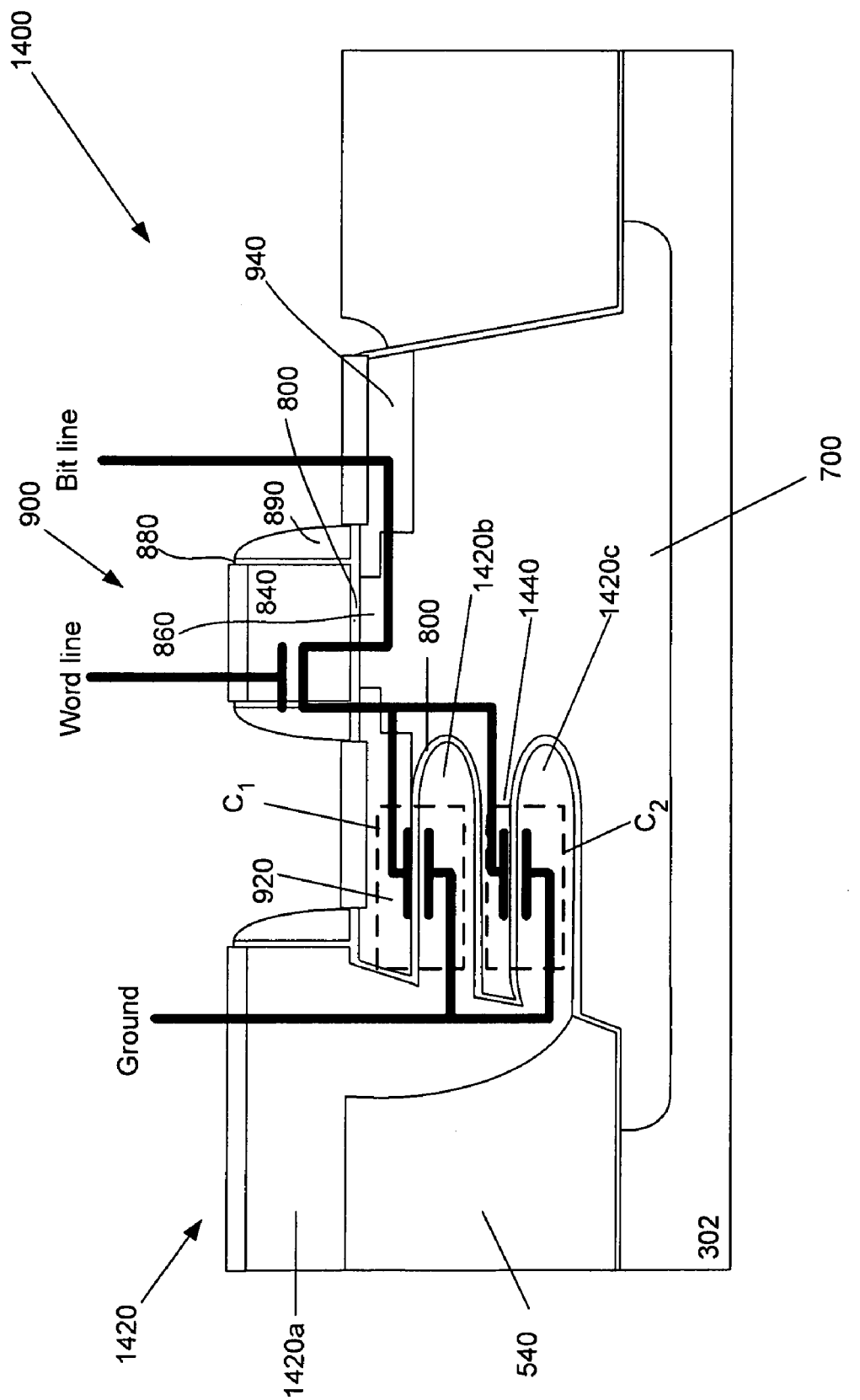
FIG. 14 is a cross-sectional view of a 1T SRAM cell in accordance with another embodiment of the invention.

In addition to the embodiment illustrated in FIGS. 12-13, the invention also contemplates a storage capacitor where the first capacitor plate comprises multiple embedded portions extending laterally into the substrate and stacked one above another. An embodiment of this concept is illustrated in FIG. 14 where a memory cell 1400 comprising an access transistor and a storage capacitor is shown. Unless otherwise indicated, features that the memory cell 1400 have in common with memory cell 300 of FIGS. 12-13 will be described with like reference numerals.

As shown in FIG. 14, the access transistor comprises a gate stack 900 including a gate electrode 840, a channel region 860 formed within the substrate below the gate electrode 840 and first and second diffusion regions (920, 940) extending from the channel region 860. The storage capacitor comprises a first capacitor plate 1420 with a first portion 1420a that overlies the trench structure 540 and two embedded portions (1420b, 1420c) extending laterally from the first portion 1420a into a well 700 formed within the substrate 302. In an alternative embodiment, the well 700 may be omitted and the embedded portions (1420b, 1420c) are formed directly within the substrate 302. The first embedded portion 1420b is located directly below the first diffusion region 920 of the access transistor and the second embedded portion 1420c is located directly below the first embedded portion 1420b. A finger portion 1440 of the substrate extends between the first and second embedded portions (1420b, 1420c) thereby separating them vertically. In this embodiment, the first and second embedded portions (1420b, 1420c) overlap the entire first diffusion region 920 and extend laterally into the well 700 by approximately the same amount.

In one embodiment, the access transistor is a PFET where the first diffusion region 920 functions as a source region and the second diffusion region 940 functions as a drain region. Interconnections (not shown) are formed to connect the drain region 940 to a bit line, the gate electrode 840 to a word line and the first capacitor plate 1420 to ground. The source 920 is coupled to the substrate 302.

As shown in FIG. 14, the storage capacitor is comprised of a combination of two capacitors, $C_1$ and $C_2$, connected in parallel. Capacitor $C_1$ includes the source region 920 which acts as the second capacitor plate, the first embedded portion 1420b of the first capacitor plate and a portion of the capacitor dielectric sandwiched between the source 920 and the first embedded portion 1420b. Capacitor $C_2$ which is connected in parallel with $C_1$ is composed of the second embedded portion 1420c which acts as a first capacitor plate, the finger portion 1440 of the substrate which acts as a second capacitor plate and a portion of the capacitor dielectric sandwiched therebetween.

Figure 15:
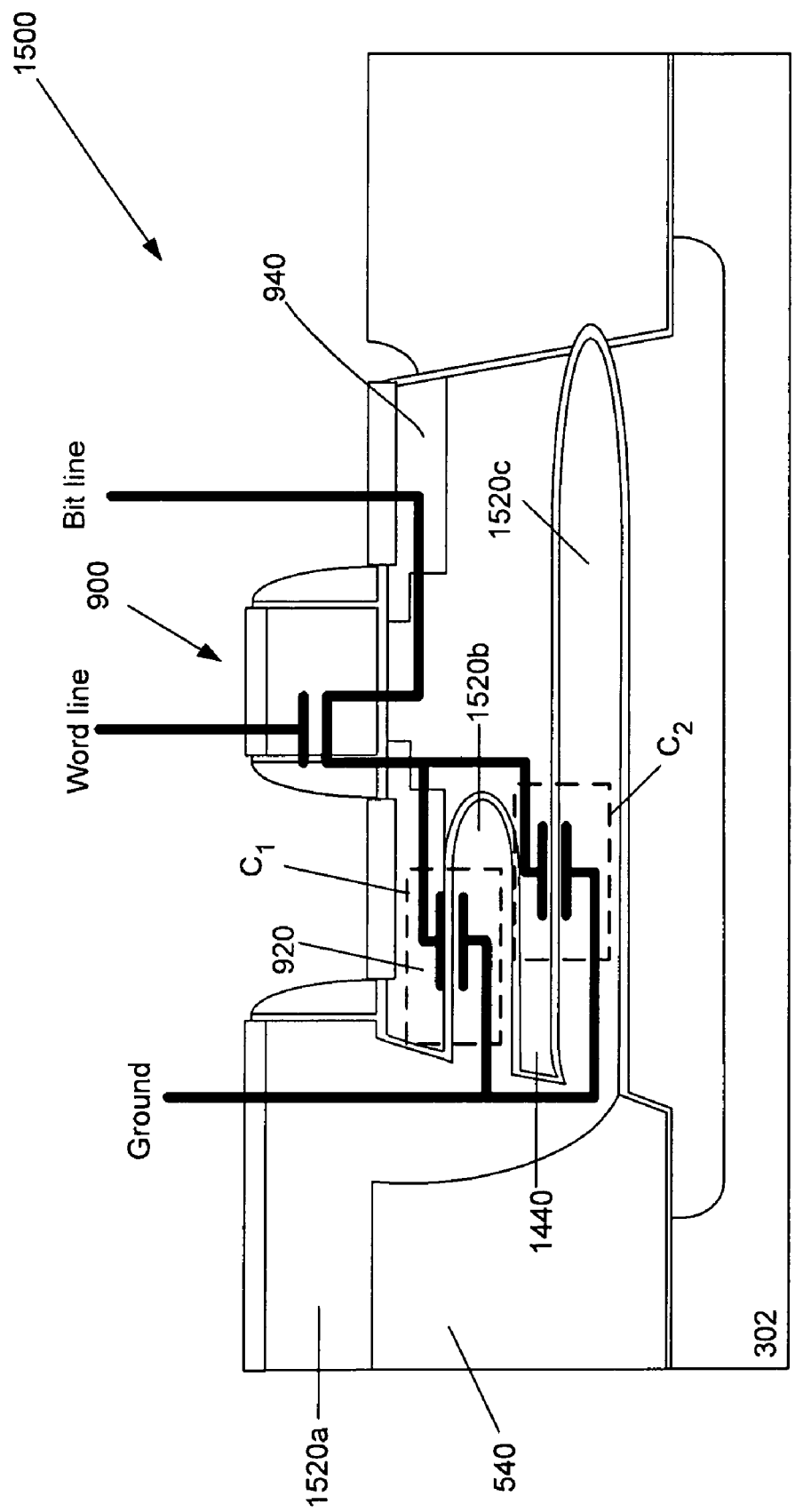
FIG. 15 is a cross-sectional view of a 1T SRAM cell in accordance with another embodiment of the invention.

FIG. 15 shows a variation of the FIG. 14 embodiment. In FIG. 15, the first capacitor plate 1520 comprises a first portion 1520a that overlies the trench structure 540 and two embedded portions (1520b, 1450c) that extend laterally from the first portion 1520a. However, unlike the storage capacitor in FIG. 14 where the first and second embedded portions (1420b, 1420c) are approximately of the same length and only overlap the first diffusion region 920, the second embedded portion 1520c in FIG. 15 is of a greater length and extends laterally to overlap the second diffusion region 940 as well. Although not illustrated in the accompanying figures, it is to be appreciated that the first capacitor plate may comprise more than two embedded plate portions.

In one embodiment, depending on the number of embedded portions desired the steps of forming a first buried region 312 and subsequently growing an overlying epitaxial layer 400 is repeated a corresponding number of times. The plurality of first buried regions is then simultaneously etched to create a number of cavities embedded within a substrate. A method similar to those described in relation to FIG. 6 may be used to selectively etch the buried regions while minimally etching adjacent substrate regions. Finally, the embedded cavities are filled with a capacitor dielectric and electrode material.

Figure 16:
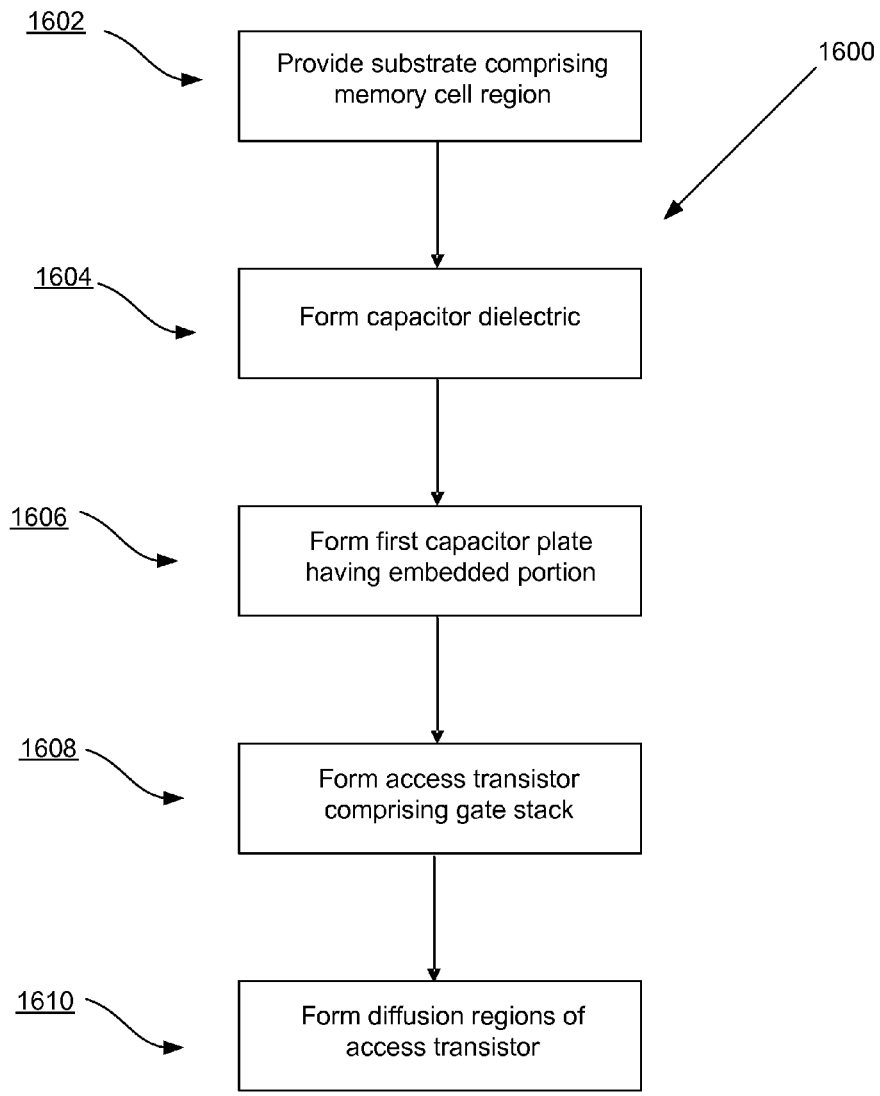
FIG. 16 is a flow chart of an integrated circuit system for manufacturing a memory cell in accordance with an embodiment of the invention.

Referring now to FIG. 16, therein is shown a flow chart 1600 for manufacturing a semiconductor device in accordance with preferred embodiment of the present invention. The system 1600 includes providing a substrate comprising a memory cell region defined thereon in a block 1602; forming a capacitor dielectric in a block 1604; forming a first capacitor plate having a portion embedded in the substrate in a block 1606; forming an access transistor comprising a gate stack disposed on the substrate in a block 1608 and forming within the substrate a first and second diffusion region of the access transistor in a block 1610, the first and second diffusion region being located adjacent opposed sides of the gate stack, wherein at least a portion of the second diffusion region forms a second capacitor plate and the capacitor dielectric is sandwiched between the embedded portion of the first capacitor plate and the second capacitor plate.

The preferred embodiment of the invention is illustrative of the invention rather than limiting of the invention. It is to be understood that revisions and modifications may be made to methods, materials, structures and dimensions of a semiconductor structure while still providing a semiconductor structure that falls within the scope of the included claims. All matters hitherto set forth herein or shown in the accompanying drawings are to be interpreted in an illustrative and non-limiting sense.

What is claimed is:

1. A memory cell comprising:
   a substrate;
   an access transistor comprising a gate stack disposed on the substrate, and a first and second diffusion regions located on a first and second opposing sides of the gate stack; and
   a storage capacitor comprising
      a first capacitor plate including a first embedded portion within the substrate below the first diffusion region,
      a second capacitor plate,
      a capacitor dielectric sandwiched between the first embedded portion of the first capacitor plate and the second capacitor plate, the capacitor dielectric surrounds the first embedded portion of the first capacitor plate, and
      wherein at least a portion of the first diffusion region forms the second capacitor plate.

2. The memory cell of claim 1, wherein the first diffusion region comprises one of a source or drain region of the access transistor and the second diffusion region comprises the other of the source or drain region of the access transistor.

3. The memory cell of claim 1, wherein the first embedded portion of the first capacitor plate comprises a cavity embedded within the substrate and filled with an electrode material, the capacitor dielectric lining the sidewalls of the cavity.

4. The memory cell of claim 1, wherein the first embedded portion of the first capacitor plate substantially overlaps the first diffusion region.

5. The memory cell of claim 1, the first capacitor plate further comprises a second embedded portion that is located underneath the first embedded portion and spaced therefrom.

6. The memory cell of claim 1, further comprising a first trench isolation structure located in the substrate adjacent to the first embedded portion of the first capacitor plate wherein the first trench isolation structure isolates the memory cells from other device regions.

7. A memory cell comprising:
   a substrate;
   an access transistor comprising a gate stack disposed on the substrate, and a first and second diffusion regions located on a first and second opposing sides of the gate stack; and
   a storage capacitor comprising
      a first capacitor plate including a first embedded portion within the substrate below the first diffusion region,
      a second capacitor plate,
      a capacitor dielectric sandwiched between the first embedded portion of the first capacitor plate and the second capacitor plate, the capacitor dielectric surrounds the first embedded portion of the first capacitor plate, and wherein at least a portion of the first diffusion region forms the second capacitor plate; and
   a first trench isolation structure located in the substrate adjacent to the first embedded portion of the first capacitor plate wherein the first trench isolation structure isolates the memory cell from other device regions.

8. The memory cell of claim 7, wherein the first capacitor plate further comprises a second portion overlying the first trench isolation structure, the second portion folding under the first diffusion region to form the first embedded portion of the first capacitor plate.

9. The memory cell of claim 8, wherein the first embedded portion of the first capacitor plate comprises a cavity embedded within the substrate and filled with an electrode material, the capacitor dielectric lining the sidewalls of the cavity.

10. A method for fabricating a memory cell comprising:
    providing a substrate with a device region defined thereon;
    forming a first capacitor plate comprising a portion embedded within the substrate in the device region;
    forming a capacitor dielectric in the device region; and
    forming an access transistor in the device region, the access transistor comprising a gate stack disposed on the substrate, and a first and second diffusion region located on a first and second opposing sides of the gate stack,
       wherein at least a portion of the first diffusion region acts as a second capacitor plate and the capacitor dielectric is sandwiched between the embedded portion of the first capacitor plate and the second capacitor plate, and
       wherein the capacitor dielectric surrounds the embedded portion of the first capacitor plate.

11. The method of claim 10, wherein forming the first capacitor plate comprises forming a first buried region in a subsurface region of the substrate in the device region and selectively etching the first buried region to form a cavity embedded within the substrate.

12. The method of claim 10, wherein the first diffusion region comprises one of a source or drain region of the access transistor and the second diffusion region comprises the other of the source or drain region of the access transistor.

13. The method of claim 10, wherein the first capacitor plate further comprises a second embedded portion that is located underneath the first embedded portion and spaced therefrom.

14. The method of claim 10, further comprising forming a first trench isolation structure in the substrate adjacent to the embedded portion of the first capacitor plate to isolate the device region from other device regions.

15. The method of claim 11, further comprising forming a capacitor dielectric that lines the sidewalls of the cavity and thereafter depositing an electrode layer over the device region, the electrode layer filling the cavity.

16. The method of claim 15, further comprising patterning the electrode layer to define the first capacitor plate and a gate electrode for the gate stack.

17. A method for fabricating a memory cell comprising:
providing a substrate with a device region defined thereon;
forming a first capacitor plate comprising a portion embedded within the substrate in the device region;
forming a capacitor dielectric in the device region;
forming a first trench isolation structure in the substrate adjacent to the embedded portion of the first capacitor plate to isolate the device region from other device regions; and
forming an access transistor in the device region, the access transistor comprising a gate stack disposed on the substrate, and a first and second diffusion region located on a first and second opposing sides of the gate stack,
wherein at least a portion of the first diffusion region acts as a second capacitor plate and the capacitor dielectric is sandwiched between the embedded portion of the first capacitor plate and the second capacitor plate.

18. The method of claim 17, wherein forming the first trench isolation structure comprises:
forming a trench in the substrate; and
filling the trench with an isolation filler material to form the first trench isolation structure.

19. The method of claim 18, wherein forming the first capacitor plate comprises forming a first buried region in a subsurface region of the substrate in the device region and selectively etching the first buried region to form a cavity embedded within the substrate.

20. The method of claim 18, wherein the isolation filler material has a lower density at regions proximate a corner of the trench.

21. The method of claim 19, wherein at least a portion of the first buried region is exposed while forming the trench in the substrate.

22. The method of claim 21, further comprising etching the first buried region to form the cavity after forming the trench in the substrate.

\* \* \* \* \*